United States Patent
Ootake

(10) Patent No.: US 8,415,193 B2
(45) Date of Patent: Apr. 9, 2013

(54) METHOD FOR MANUFACTURING SOLID STATE IMAGE FORMING DEVICE, AND SOLID STATE IMAGE FORMING DEVICE

(75) Inventor: Hajime Ootake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/840,622

(22) Filed: Jul. 21, 2010

(65) Prior Publication Data

US 2011/0018080 A1 Jan. 27, 2011

(30) Foreign Application Priority Data

Jul. 22, 2009 (JP) .................................. 2009-171477

(51) Int. Cl.
*H01L 21/00* (2006.01)

(52) U.S. Cl.
USPC .................. 438/65; 438/69; 438/70; 257/432; 257/440; 257/E31.127

(58) Field of Classification Search .................. 257/432; 438/65
See application file for complete search history.

(56) References Cited

U.S. PATENT DOCUMENTS

| | | | |
|---|---|---|---|
| 5,466,926 A * | 11/1995 | Sasano et al. .................. 250/216 |
| 7,884,435 B2 | 2/2011 | Jun | |
| 2005/0042861 A1 | 2/2005 | Redeker et al. | |
| 2005/0078377 A1* | 4/2005 | Li et al. .......... 359/619 |
| 2008/0137207 A1 | 6/2008 | Jun | |
| 2008/0283726 A1* | 11/2008 | Uya et al. ................... 250/208.1 |
| 2008/0290383 A1* | 11/2008 | Dunne et al. ................. 257/292 |
| 2009/0034083 A1 | 2/2009 | Li et al. | |

FOREIGN PATENT DOCUMENTS

| | | |
|---|---|---|
| CN | 1973373 A | 5/2007 |
| CN | 101201539 A | 6/2008 |
| JP | 2000-22117 | 1/2000 |
| JP | 2008-522245 | 6/2008 |
| JP | 2009-88430 | 4/2009 |

OTHER PUBLICATIONS

U.S. Appl. No. 13/225,907, filed Sep. 6, 2011, Ootake.
U.S. Appl. No. 13/050,530, filed Mar. 17, 2011, Ootake.
Chinese Office Action issued Jan. 18, 2012, in Chinese Patent Application No. 201010235342.3 with Partial English translation.

* cited by examiner

*Primary Examiner* — Ajay K Arora
(74) *Attorney, Agent, or Firm* — Oblon, Spivak, McClelland, Maier & Neustadt, L.L.P.

(57) ABSTRACT

A method for manufacturing a solid state image forming device according to an embodiment includes forming a transparent resin layer 20 on a semiconductor substrate 11, having a plurality of photodiode layers 12 formed thereon in a lattice, through R, G, and B color filters that are formed according to a Bayer arrangement; forming a plurality of first microlens mother dies 23 on the transparent resin layer 20 at the positions corresponding to the green color filters G in such a manner that the outer peripheries thereof are separated from each other; forming a plurality of second microlens mother dies 24 in such a manner that they are formed to fill the gap between the first microlens mother dies 23 and the outer peripheries thereof are separated from each other; and etching the transparent resin layer 20 with the plurality of first microlens mother dies 23 and the plurality of second microlens mother dies 24 being used as masks.

10 Claims, 16 Drawing Sheets

METHOD FOR MANUFACTURING SOLID STATE IMAGE FORMING DEVICE, AND SOLID STATE IMAGE FORMING DEVICE

CROSS REFERENCE TO RELATED APPLICATIONS

This application is based upon and claims the benefit of priority from the prior Japanese Patent Application No. 2009-171477 filed in Japan on Jul. 22, 2009; the entire contents of which are incorporated herein by reference.

FIELD

An embodiment of the present invention relates to a method for manufacturing a solid state image forming device, and a solid state image forming device.

BACKGROUND

A solid state image forming device, which is used for a digital camera, a build-in camera of a cellular phone, or a monitoring camera as an area sensor, converts light detected by a photodiode into charges, transfers the converted charges by a CCD (Charge Coupled Device) or a CMOS device, and outputs the resultant.

There has been known, as the solid state image forming device described above, the one having a plural rectangular photodiodes arranged and formed on a semiconductor substrate in a lattice, a color filter layer formed on each of the photodiodes, and a plurality of circular microlenses arranged on the respective color filter layers in such a manner that a part of the circumference of the respective microlenses is in contact with each other.

According to the solid state image forming device described above, since the adjacent microlenses are formed to be in contact with each other, even the light incident between the adjacent microlenses is converged onto the photodiode. Therefore, a solid state image forming device having a high sensitivity can be formed.

However, the planar shape of the microlens is circular, so that the microlens is not formed on the corner of the rectangular color filter. Accordingly, the light incident on this portion is reflected by a wiring layer formed between the semiconductor substrate and the color filter layer, and not converged onto the photodiode. Therefore, there arises a problem that it is difficult to more enhance the sensitivity.

DETAILED DESCRIPTION

The embodiments of the present invention will be described in detail with reference to the drawings.

First Embodiment

Figure 1:
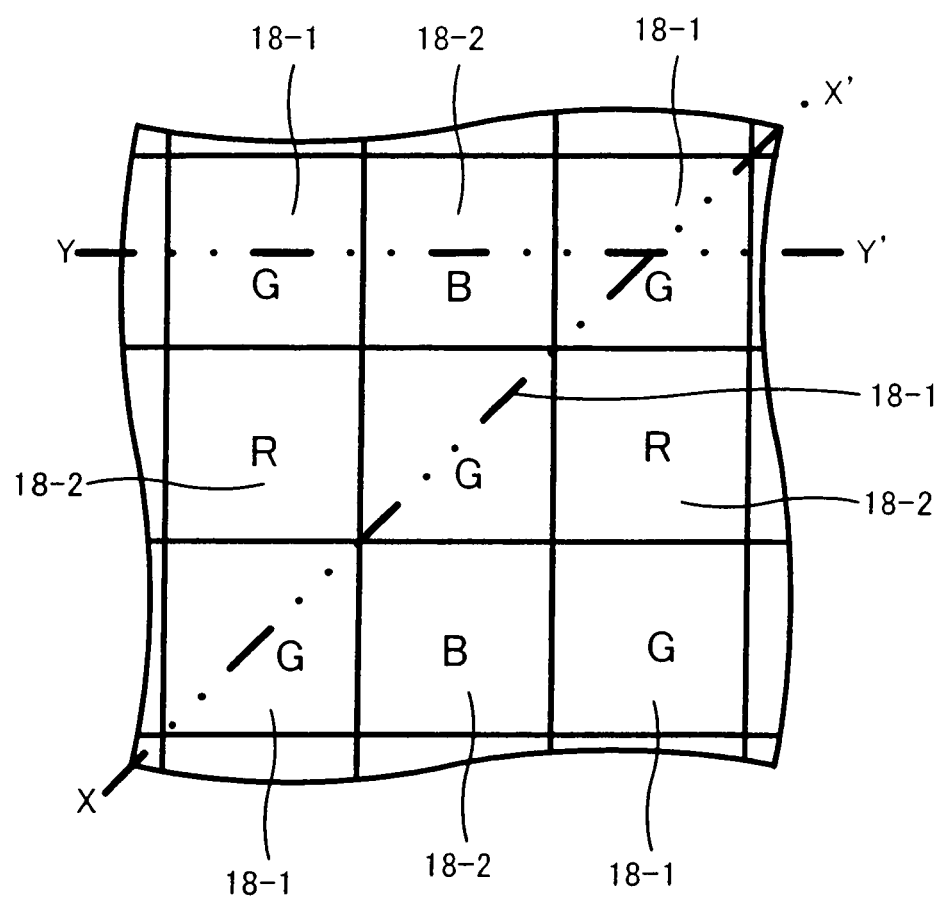
FIG. 1 is a top view illustrating a part of a solid state image forming device according to a first embodiment.
Figure 2:
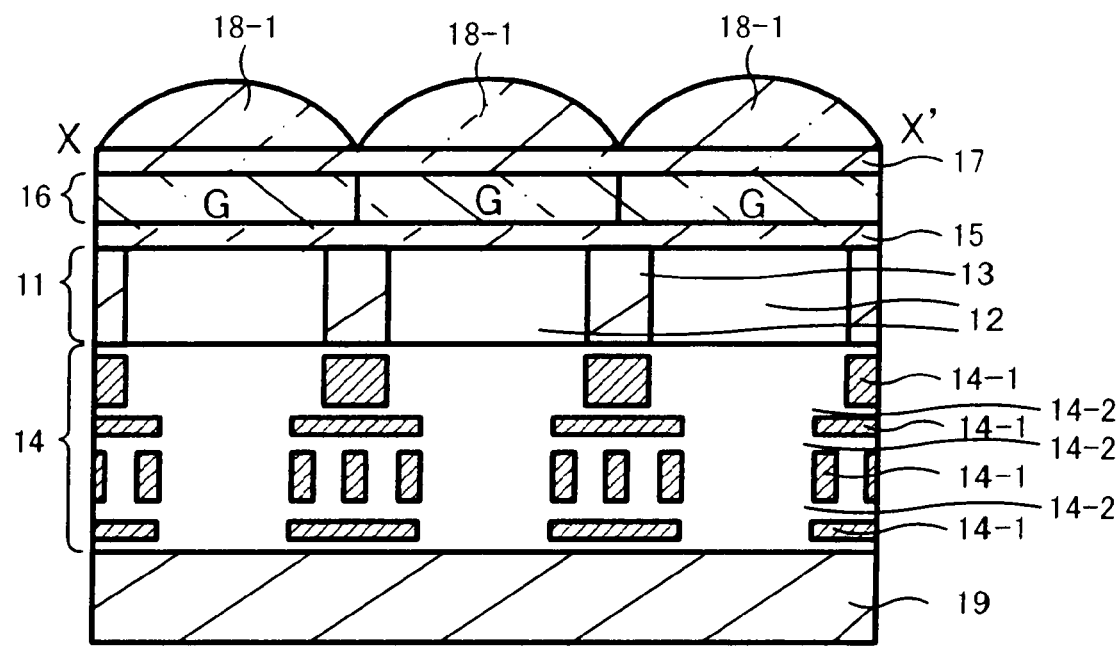
FIG. 2 is a sectional view taken along a two-dot chain line X-X' in FIG. 1.
Figure 3:
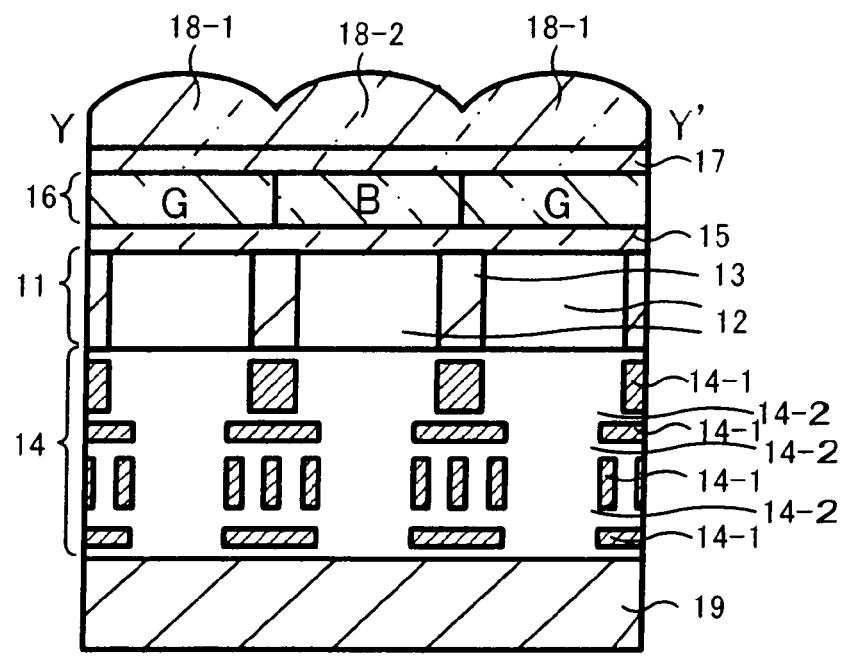
FIG. 3 is a sectional view taken along a two-dot chain line Y-Y' in FIG. 1.

FIG. 1 is a top view illustrating a part of a solid state image forming device formed by a method for manufacturing a solid state image forming device according to a first embodiment. FIG. 2 is a sectional view taken along a two-dot chain line X-X' in FIG. 1, and FIG. 3 is a sectional view taken along a two-dot chain line Y-Y' in FIG. 1. R, G, and B illustrated in the respective drawings described later respectively indicate a transmitted wavelength band of the color filter layer, which will be described in detail later.

As illustrated in FIGS. 2 and 3, in the solid state image forming device according to the first embodiment, a plurality of photodiode layers 12 are arranged and formed on a semiconductor substrate 11, which is made of silicon, for example, in a lattice. These photodiode layers 12 are formed to be exposed to the front surface and the back surface of the semiconductor substrate 11.

The semiconductor substrate 11 between the photodiode layers 12 functions as a pixel separating layer 13. The photodiode layers 12 are formed in a lattice so as to correspond to the positions of the respective color filters R, G, and B illustrated in FIG. 1. The planar shapes of the respective color filters R, G, and B and the photodiode layers 12 formed so as to correspond to the positions of the respective color filters are rectangle and square, respectively. The tow-dot chain line X-X' in FIG. 1 described above corresponds to the diagonal line of the photodiode layers 12 as a whole arranged in a lattice.

A wiring layer 14 is formed on the front surface of the semiconductor substrate 11. The wiring layer 14 has a multi-wire structure including layers 14-1 on which a wiring is formed and insulating layers 14-2 that insulate the layers 14-1, wherein the layers 14-1 and the insulating layers 14-2 are alternately formed. Each of the layers 14-1 having the wiring formed thereon includes a reading gate for transferring the charges, which are subject to a photo-electrical conversion in the photodiode layer 12, to a charge transfer section (not illustrated) such as a vertical transfer register.

On the other hand, a color filter layer 16 is formed on the back surface of the semiconductor substrate 11 through a first planarizing layer 15. The color filter layer 16 includes a red color filter R that transmits a red wavelength, a blue color filter B that transmits blue wavelength, and a green color filter G that transmits green wavelength, as illustrated in FIG. 1. The red color filter R, the blue color filter B, and the green color filter G are arranged according to a Bayer arrangement, for example.

A second planarizing layer 17 is formed on the color filter layer 16. A first microlens 18-1 is formed on each of the green color filters G, which constitutes the color filter 16, through the second planarizing layer 17. That is, as illustrated in FIG. 1, the first microlenses 18-1 are formed checkerwise on the second planarizing layer 17 illustrated in FIGS. 2 and 3. As illustrated in FIG. 1, a second microlens 18-2 is formed on each of the blue color filters B through the second planarizing layer 17 illustrated in FIGS. 2 and 3. Although not illustrated, a second microlens 18-2 is also formed on each of the red color filters R through the second planarizing layer 17 illustrated in FIGS. 2 and 3.

The second planarizing layer 17 and the first and second microlenses 18-1 and 18-2 illustrated in FIGS. 2 and 3 are made of a single transparent resin layer, wherein the upper processed area of this layer serves as the respective microlenses 18-1 and 18-2, while the lower non-processed area of the microlenses 18-1 and 18-2 serves as the second planarizing layer 17.

As illustrated in FIG. 1, the planar shape of each of the first and second microlenses 18-1 and 18-2 is rectangle, and the sectional shape thereof is convex as illustrated in FIGS. 2 and 3. The first and the second microlenses 18-1 and 18-2 having such configuration are formed in such a manner that the outer periphery of the first microlens 18-1 and the outer periphery of the second microlens 18-2 that is adjacent to the first microlens 18-1 are brought into contact with each other. That is, the first and the second microlenses 18-1 and 18-2 are formed on the color filter layer 16 with no gap formed therebetween.

The solid state image forming device having the wiring layer 14, the color filter layer 16, and the first and second microlenses 18-1 and 18-2 is a so-called rear-surface reflection type, wherein it is supported by a support substrate 19 that is formed on the front surface (on the lower surface of the wiring layer 14 in FIGS. 2 and 3) and made of silicon, for example.

Figure 4:
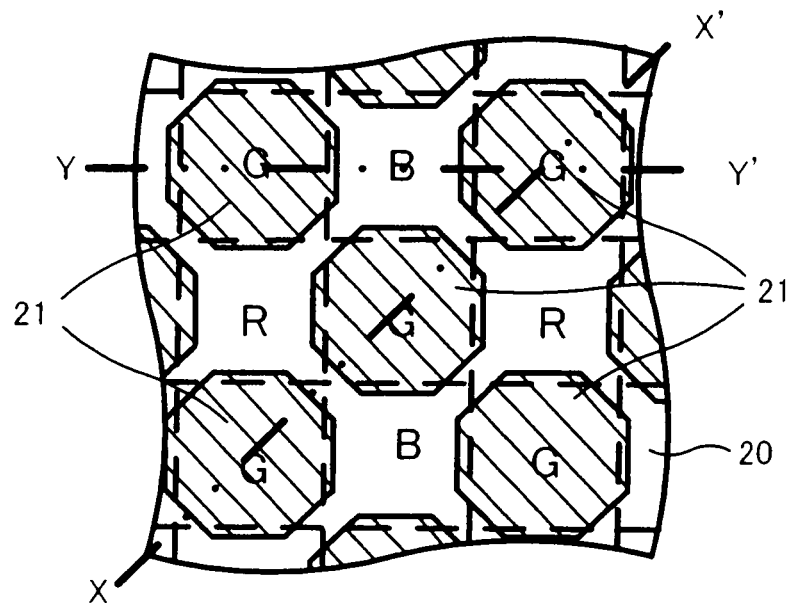
FIG. 4 is a top view illustrating a manufacturing process of the solid state image forming device illustrated in FIG. 1.
Figure 5:
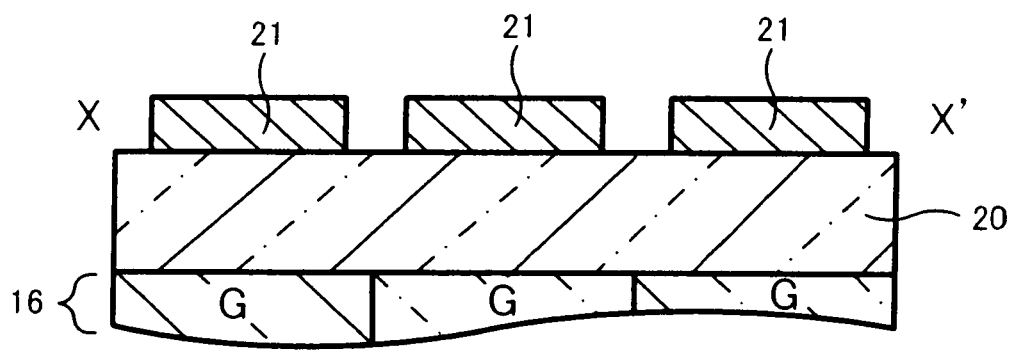
FIG. 5 is a sectional view taken along a two-dot chain line X-X' in FIG. 4.
Figure 6:
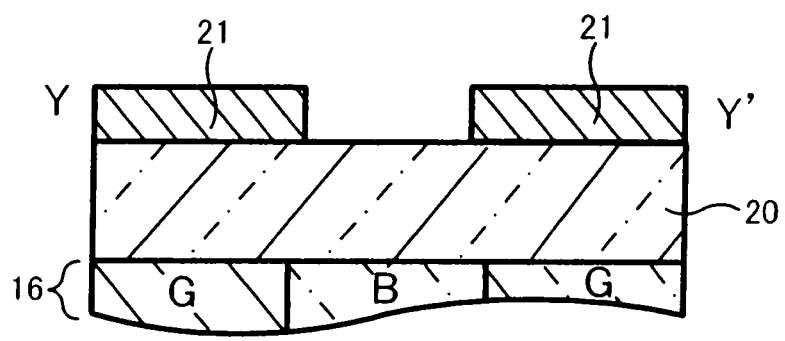
FIG. 6 is a sectional view taken along a two-dot chain line Y-Y' in FIG. 5.
Figure 7:
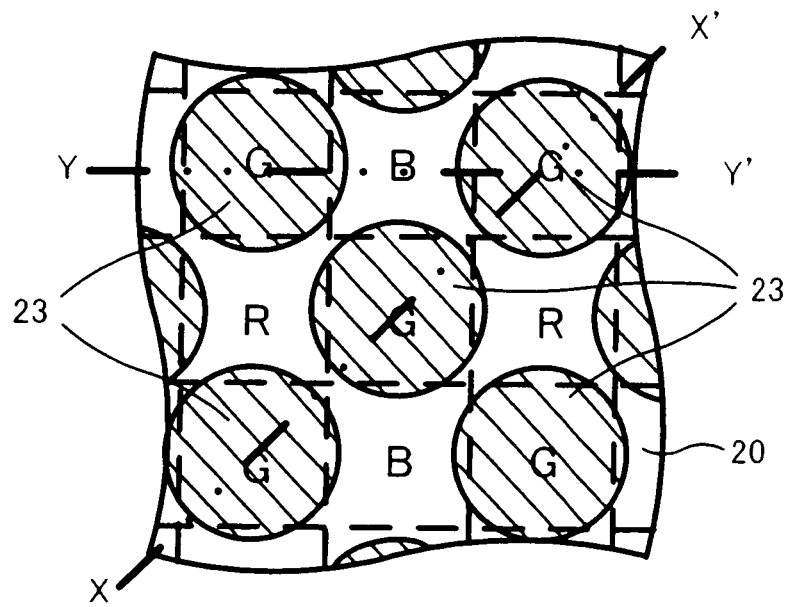
FIG. 7 is a top view illustrating a manufacturing process of the solid state image forming device illustrated in FIG. 1.
Figure 8:
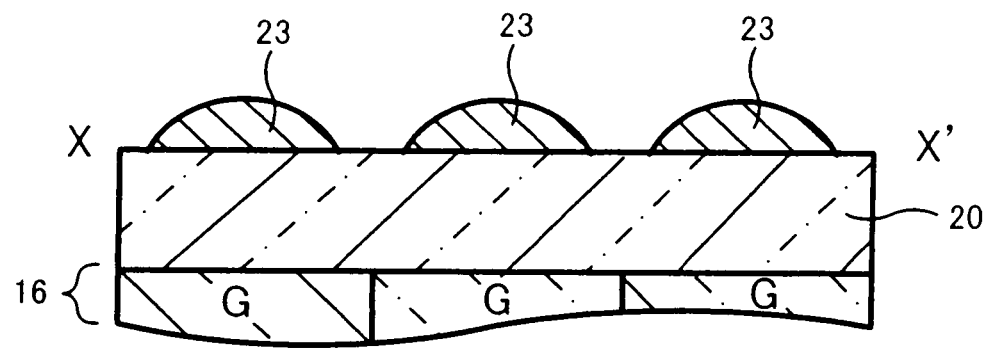
FIG. 8 is a sectional view taken along a two-dot chain line X-X' in FIG. 7.
Figure 9:
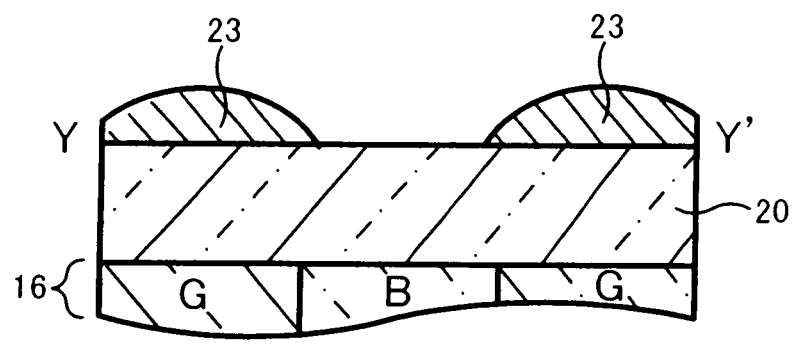
FIG. 9 is a sectional view taken along a two-dot chain line Y-Y' in FIG. 7.
Figure 10:
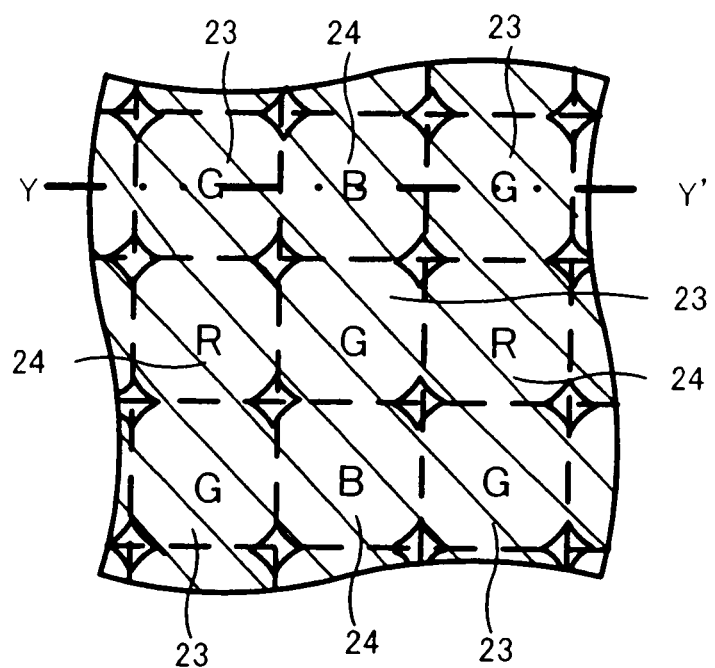
FIG. 10 is a top view illustrating a manufacturing process of the solid state image forming device illustrated in FIG. 1.
Figure 11:
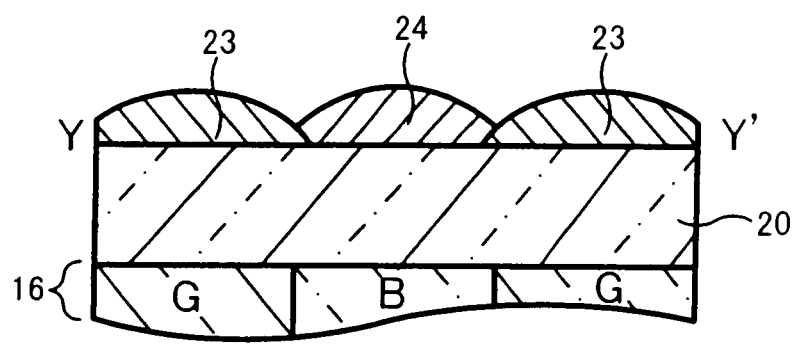
FIG. 11 is a sectional view taken along a two-dot chain line Y-Y' in FIG. 10.
Figure 12:
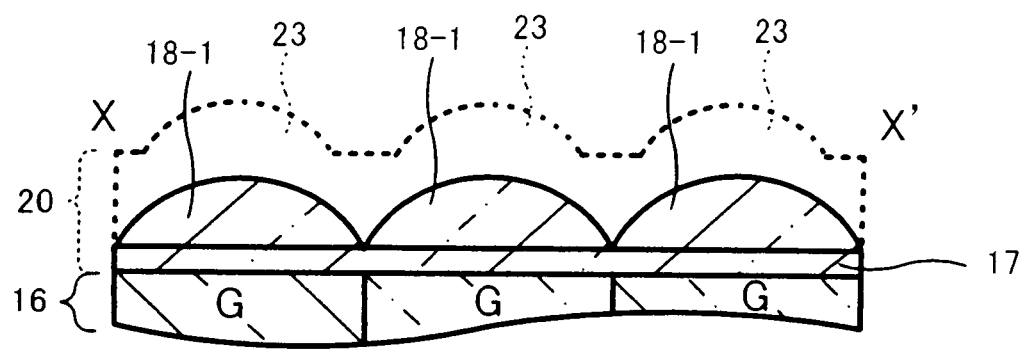
FIG. 12 is a sectional view illustrating a manufacturing process of the solid state image forming device illustrated in FIG. 1 taken along a two-dot chain line X-X'.
Figure 13:
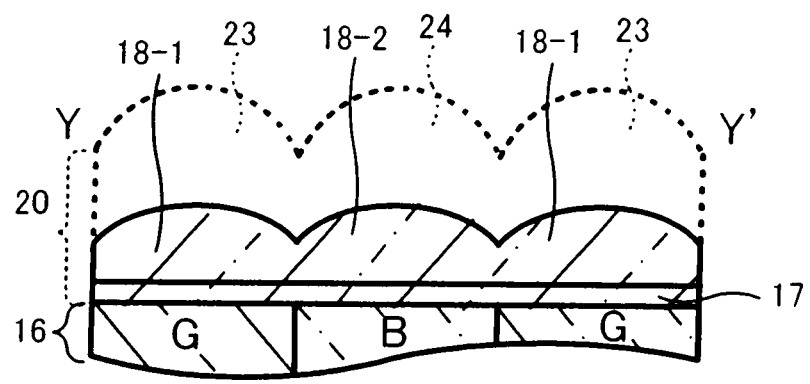
FIG. 13 is a sectional view illustrating a manufacturing process of the solid state image forming device illustrated in FIG. 1 taken along a two-dot chain line Y-Y'.

Next, a method for manufacturing the solid state image forming device according to the first embodiment will be described. The method for manufacturing the solid state image forming device according to the first embodiment is the same as the method for manufacturing a conventional rear-surface reflection type solid state image forming device, except for the method for manufacturing the first and the second microlenses 18-1 and 18-2. Therefore, the method for manufacturing the first and the second microlenses 18-1 and 18-2 will be described below with reference to FIGS. 4 to 13. FIGS. 4, 7, and 10 are top views illustrating the method for manufacturing the solid state image forming device. FIGS. 5 and 8 are sectional views taken along the two-dot chain line X-X' in FIGS. 4 and 7 respectively, and FIGS. 6, 9, and 11 are sectional views taken along a line Y-Y' in FIGS. 4, 7, and 10, respectively. FIGS. 12 and 13 are sectional views illustrating the manufacturing process of the solid state image forming device according to the present embodiment taken along the two-dot chain lines X-X' and Y-Y' in FIG. 1.

As illustrated in FIGS. 4, 5, and 6, a transparent resin layer 20 is uniformly formed on the respective color filters R, G, and B. An octagonal first mother die material 21, which is to become a mother die of the first microlens, is formed on the green color filter G through the transparent resin layer 20. The first mother die material 21 is a resin having photosensitivity and thermal flowability, formed by exposing and developing after it is formed such that it is uniformly applied onto the transparent resin layer 20.

As illustrated in FIGS. 4 and 5, the first mother die material 21 is not formed on a part of the contact point between the adjacent green color filters. Further, as illustrated in FIGS. 4 and 6, it is formed to project to a part of the adjacent blue color filter B or to a part of the adjacent red color filter R. That is, the first mother die materials 21 are formed to be separated from each other, whereby they are separated from each other when they are subject to the heat treatment at the next process.

Next, as illustrated in FIGS. 7, 8, and 9, a convex first microlens mother die 23 is formed by a melting method. That is, the first mother die material 21 is heated to be fluidized, thereby allowing the first mother die material 21 to be formed into a convex shape. In the state in which the first mother die material 21 is formed into a convex shape, the convex first mother die material 21 is further heated to be cured, whereby the first-microlens mother die 23 is formed. The first-microlens mother dies 23 are not formed on the contact point of the adjacent green color filters G, but formed to project to a part of the blue color filter B adjacent to the green color filter G or to a part of the red color filter R adjacent to the green color filter G.

Next, as illustrated in FIGS. 10 and 11, a convex second microlens mother die 24 is formed on the blue color filter B and the red color filter R through the transparent resin layer 20. Like the first-microlens mother die 23, the second-microlens mother die 24 is formed in such a manner that octagonal second mother die materials (not illustrated) same as the first microlens mother die material 21 are formed to be separated from each other in order to fill the space between the first microlens mother die materials 23, and then, the resultant is heat-treated.

As illustrated in FIG. 10, the second microlens mother dies 24 are formed to be separated from each other at the contact point of the blue color filter B and the red color filter R. Further, as illustrated in FIG. 11, the second microlens mother dies 24 are formed so as to enclose the vicinity of the outer periphery of the first-microlens mother die 23 and so as to fill the space between the first-microlens mother dies 23. The second-microlens mother dies 24 are formed in such a manner that the outer peripheries of the second-microlens mother dies 24 are positioned on the boundary between the blue color filter B and the green color filter G, and on the boundary between the red color filter R and the green color filter G.

When the second microlens mother dies 24 are formed by the melting method, the first-microlens mother dies 23 have already been cured. Therefore, there is no chance that the first-microlens mother die material 22 is fluidized to be deformed during the heat treatment to the second mother die material. Finally, as illustrated in FIGS. 12 and 13, the transparent resin layer 20 is subject to dry etching with the first microlens mother dies 23 and the second microlens mother dies 24 used as masks, whereby the first and second microlenses 18-1 and 18-2 are formed on the color filter layer 16.

As illustrated in FIG. 12, the first-microlens mother dies 23 are formed so as to be separated from each other at the contact point of the adjacent green color filters G. Although not illustrated, the second-microlens mother dies 24 are similarly formed so as to be separated from each other on the contact point of the blue color filter B and the red color filter R. Accordingly, gaps are formed on the point where the adjacent green color filters G are in contact with each other and on the point where the red color filter R and the blue color filter B, which are adjacent to the green color filters G, are respectively in contact with each other. However, a reaction product generated upon the etching is deposited onto the first-microlens mother die 23 and the second-microlens mother die 24, wherein the deposited materials and the first and second microlens mother dies 23 and 24 serve as a mask upon etching the transparent resin layer 20. Therefore, as illustrated in FIG. 12, the etched area is gradually reduced with the progression of the etching, whereby the first and second microlenses 18-1 and 18-2, which have the size greater than the size of the first and second microlens mother dies 23 and 24, are formed.

On the other hand, as illustrated in FIG. 13, the portion where the outer periphery of the second microlens mother die 24 is overlapped with the first microlens mother die 23 is located on the boundary between the green color filter G and the blue color filter B. Accordingly, the boundary between the first microlens 18-1 and the second microlens 18-2, which are formed by the etching, is formed on the boundary between the green color filter G and the blue color filter B.

As described above, the first microlenses 18-1 and the second microlenses 18-2 are formed in such a manner that the outer peripheries of the respective microlenses 18-1 and 18-2 are always in contact with either one of the microlenses 18-1 and 18-2. Accordingly, the first and the second microlenses 18-1 and 18-2 are formed with no gap formed therebetween.

As described above, in the solid state image forming device formed by the method for manufacturing the solid state image forming device according to the first embodiment, the first and the second microlenses 18-1 and 18-2 are formed on the color filter layer 16 with no gap formed therebetween. Therefore, the light incident on the solid state image forming device is always converged onto the desired portion by the first or the second microlenses 18-1 and 18-2. Consequently, this configuration prevents the light incident on the solid state image forming device from being incident on the photodiode layer 12 through a color filter other than the desired color filters R, G, and B, regardless of vertical incidence or oblique incidence. Thus, the color mixture can be prevented.

Second Embodiment

Figure 14:
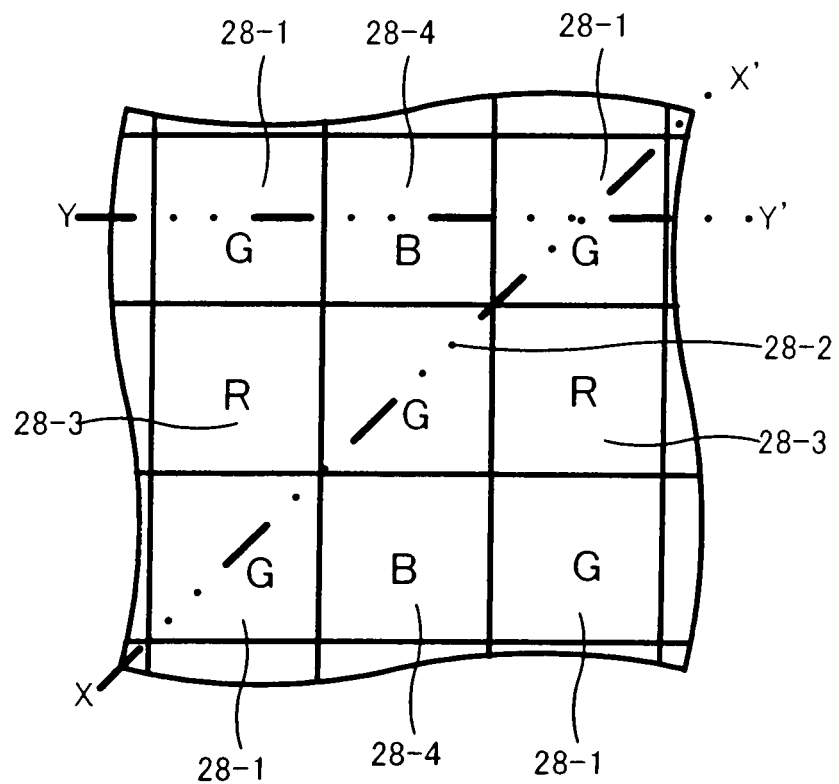
FIG. 14 is a top view illustrating a part of a solid state image forming device according to a second embodiment.
Figure 15:
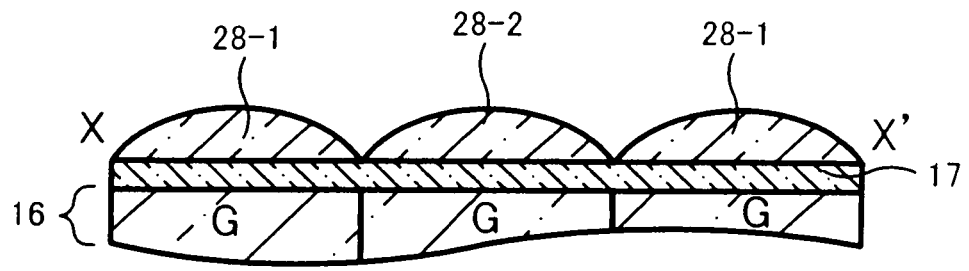
FIG. 15 is a sectional view taken along a two-dot chain line X-X' in FIG. 14.
Figure 16:
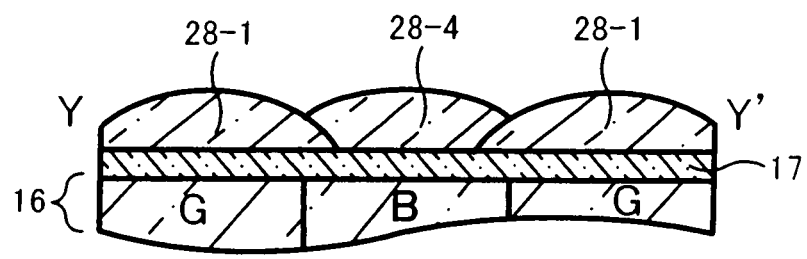
FIG. 16 is a sectional view taken along a two-dot chain line Y-Y' in FIG. 14.

FIG. 14 is a top view of a solid state image forming device according to the second embodiment. FIG. 15 is a sectional view taken along a two-dot chain line X-X' in FIG. 14, while FIG. 16 is a sectional view taken along a two-dot chain line Y-Y' in FIG. 14.

As illustrated in FIG. 14, the solid state image forming device according to the second embodiment includes first and second microlenses 28-1 and 28-2 corresponding to the first microlens 18-1 illustrated in FIG. 1, and third and fourth microlenses 28-3 and 28-4 corresponding to the second microlens 18-2 illustrated in FIG. 1, wherein these microlenses are formed without having a gap therebetween. The first, second, third, and fourth microlenses 28-1, 28-2, 28-3, and 28-4 are formed on a second planarizing layer 17 as illustrated in FIGS. 15 and 16. However, these micro lenses 28-1, 28-2, 28-3, and 28-4 and the second planarizing layer 17 are not simultaneously formed by etching the transparent resin layer, as in the solid state image forming device according to the first embodiment.

The method for manufacturing the solid state image forming device according to the second embodiment is different from the method according to the first embodiment only in the method for manufacturing the micro lenses. Therefore, the method for manufacturing the micro lenses 28-1, 28-2, 28-3, and 28-4 will be described below with reference to FIGS. 17 to 30. FIGS. 17, 20, 23, 25, 27, and 29 are top views illustrating the method for manufacturing the solid state image forming device FIGS. 18, 21, and 24 are sectional views taken along a two-dot chain line X-X' in FIGS. 17, 20, and 23, FIGS. 19, 22, and 30 are sectional views taken along a two-dot chain line Y-Y' in FIGS. 17, 20, and 29, and FIGS. 26 and 28 are sectional views taken along a two-dot chain line Z-Z' in FIGS. 25 and 27.

Figure 17:
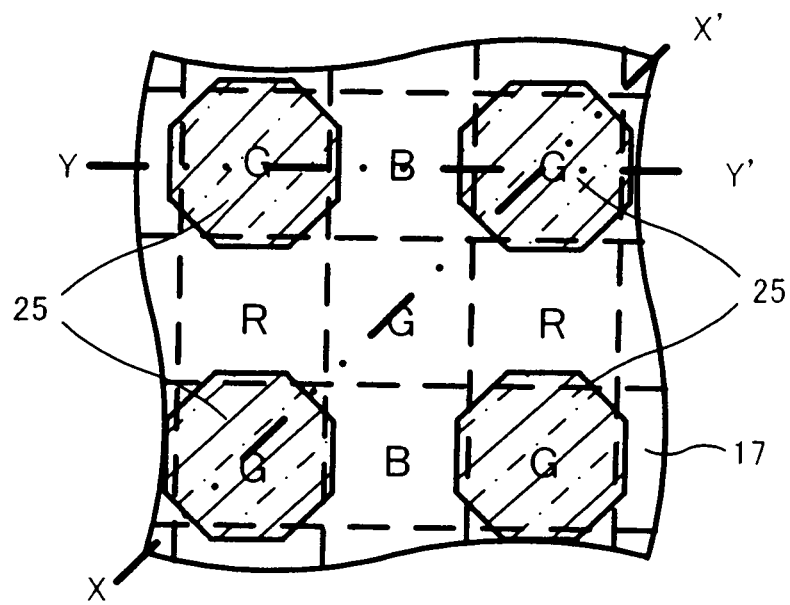
FIG. 17 is a top view illustrating a manufacturing process of the solid state image forming device illustrated in FIG. 14 according to the second embodiment.
Figure 18:
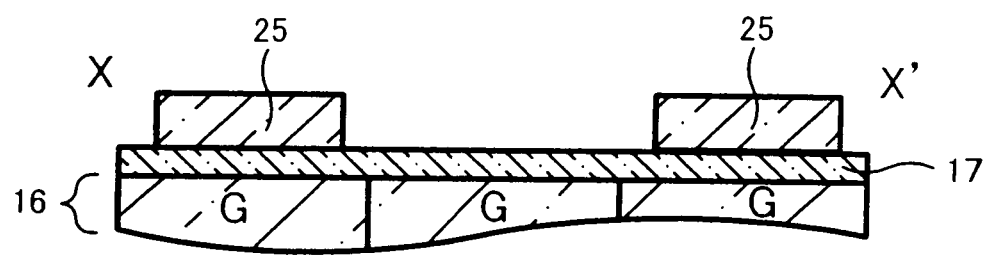
FIG. 18 is a sectional view taken along a two-dot chain line X-X' in FIG. 17.
Figure 19:
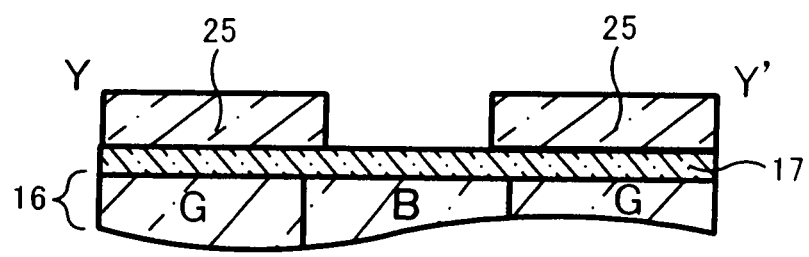
FIG. 19 is a sectional view taken along a two-dot chain line Y-Y' in FIG. 17.

As illustrated in FIGS. 17, 18, and 19, an octagonal first microlens material 25 is formed on some green color filter G. The first microlens materials 25 are formed so as to be separated from each other in a lattice every other pixel. Therefore, the first microlens materials 25 are not formed on some green color filters G of the plurality of green color filters G at this point.

The first microlens material 25 is a resin having photosensitivity, and thermal flowability, and it is formed such that a transparent resin layer is uniformly applied onto the second planarizing layer 17 on the color filter layer 16, and then, the resultant is exposed and developed.

As illustrated in FIGS. 17 and 18, the first microlens materials 25 are not formed on the contact point between the adjacent green color filters G. Further, as illustrated in FIGS. 17 and 19, they are formed to project to a part of the adjacent blue color filter B or to a part of the adjacent red color filter R.

Figure 20:
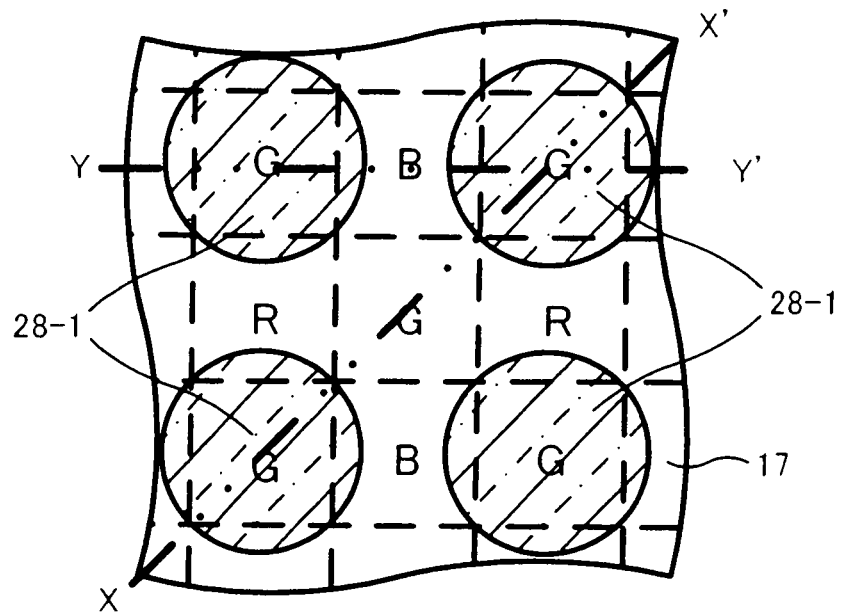
FIG. 20 is a top view illustrating a manufacturing process of the solid state image forming device illustrated in FIG. 14 according to the second embodiment.
Figure 21:
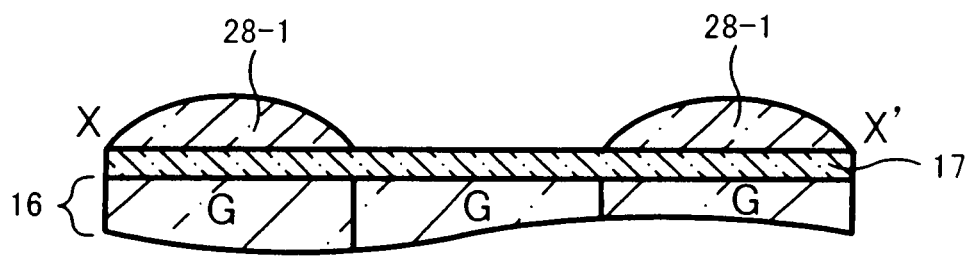
FIG. 21 is a sectional view taken along a two-dot chain line X-X' in FIG. 20.
Figure 22:
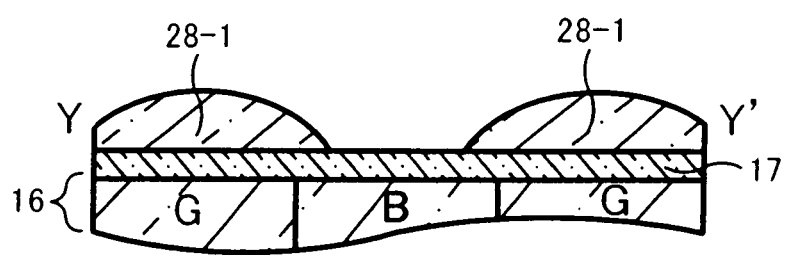
FIG. 22 is a sectional view taken along a two-dot chain line Y-Y' in FIG. 20.

Next, as illustrated in FIGS. 20, 21, and 22, convex first microlenses 28-1 are formed by a melting method. That is, the first microlens materials 25 are heat-treated to be fluidized, thereby allowing the first microlens materials 25 to be formed into a convex shape. In the state in which the first microlens materials 25 are formed into a convex shape, the convex first microlens materials 25 are further heated to be cured, whereby the first microlenses 28-1 are formed so as to be separated from each other. Each of the first microlenses 28-1 is formed in such a manner that the outer periphery thereof is located on the contact point of the adjacent green color filters G and on a part of the flue color filter B and the red color filter R, which are adjacent to the green color filter G. That is, the first microlens 28-1 is formed such that the green color filter G is internally in contact with the outer periphery of the first microlens 28-1 on the second planarizing layer 17. This can be achieved by using the first microlens material 25 having the size designed beforehand in order that the outer periphery of the first microlens 28-1 is formed on the above-mentioned position, when the first microlens material 25 is heat-treated.

Figure 23:
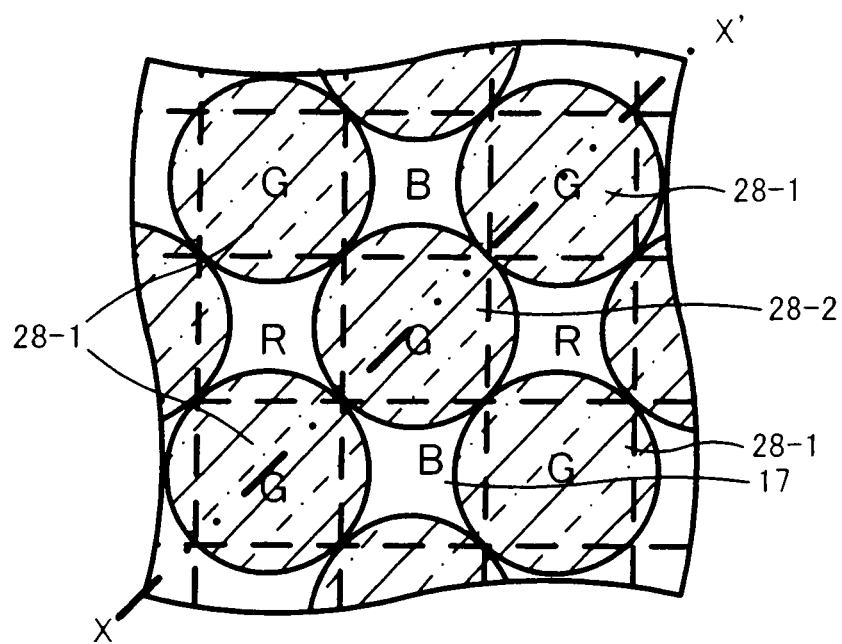
FIG. 23 is a top view illustrating a manufacturing process of the solid state image forming device illustrated in FIG. 14 according to the second embodiment.
Figure 24:
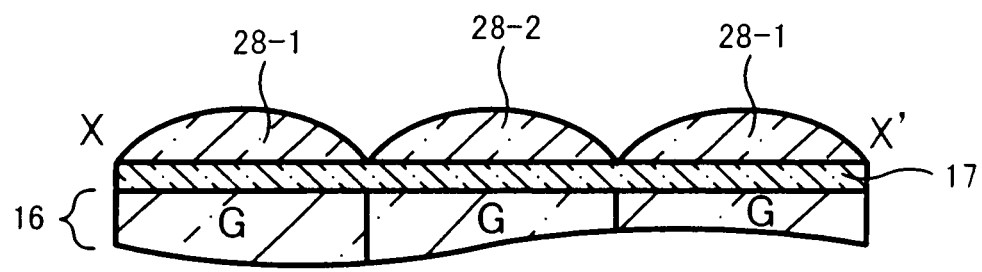
FIG. 24 is a sectional view taken along a two-dot chain line X-X' in FIG. 23.

Next, as illustrated in FIGS. 23 and 24, second microlens 28-2 is formed at the position surrounded on all four sides by the first microlenses 28-1. That is, the second microlens 28-2 is formed on the green color filter G on which the first microlens 28-1 is not formed. This can be achieved in the same manner as the method illustrated in FIGS. 17 and 20, that is, a second microlens material (not illustrated) is formed by the exposure and development on the green color filter G on which the first microlens 28-1 is not formed, and then, the resultant is heat-treated, as illustrated by the process in FIGS. 23 and 24. With this process, the first microlenses 28-1 or the second microlenses 28-2 are formed on all green color filters G. The first and second microlenses 28-1 thus formed are arranged such that a part of the outer peripheries of the first and second microlenses are brought into contact with each other on the contact point of the adjacent green color filters G.

Figure 25:
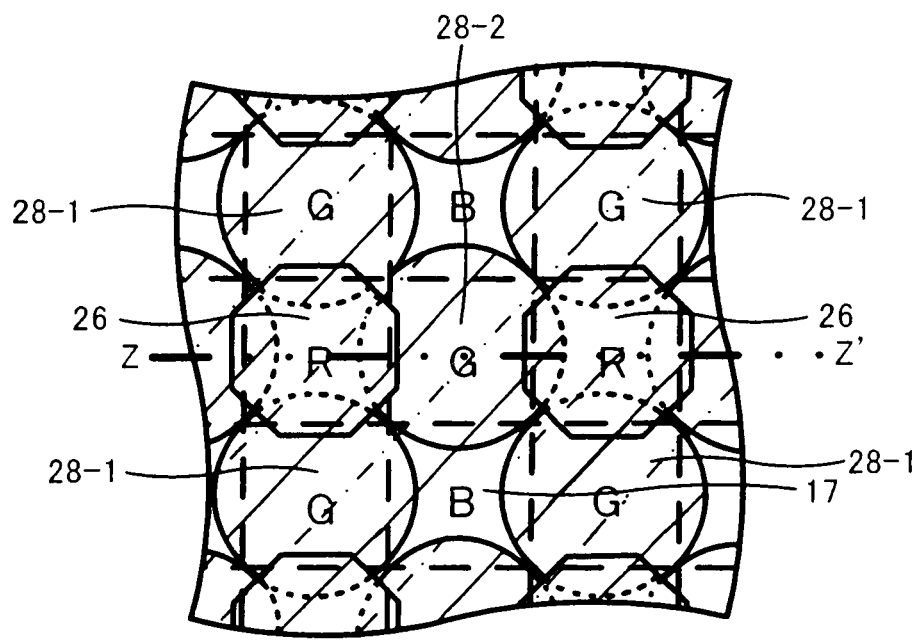
FIG. 25 is a top view illustrating a manufacturing process of the solid state image forming device illustrated in FIG. 14 according to the second embodiment.
Figure 26:
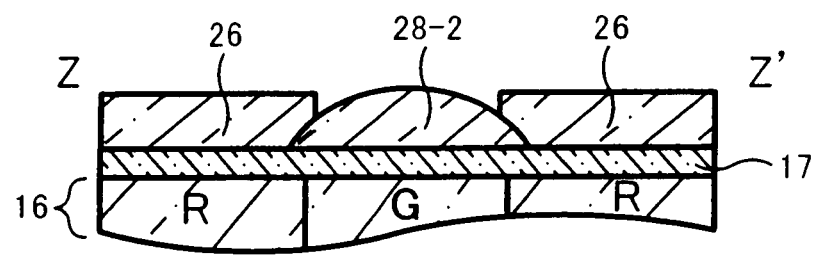
FIG. 26 is a sectional view taken along a two-dot chain line Z-Z' in FIG. 25.

Next, as illustrated in FIGS. 25 and 26, an octagonal third microlens material 26 is formed on the red color filter R through the second planarizing layer 17. That is, the third microlens material 26 is formed to fill the gap, among the plurality of gaps between the first microlenses 28-1 and the second microlens 28-2, at the position arranged in a lattice every other pixel. The third microlens material 26 is also formed from the material same as that of the first microlens material 25 and the second microlens material (not illustrated) and formed by the manufacturing method same as that of the first microlens material 25 and the second microlens material (not illustrated).

The third microlens material 26 is not formed on the contact point between the red color filter R and the blue color filter B, but is formed to project to a part of the adjacent green color filter G, like the first microlens material 25.

Figure 27:
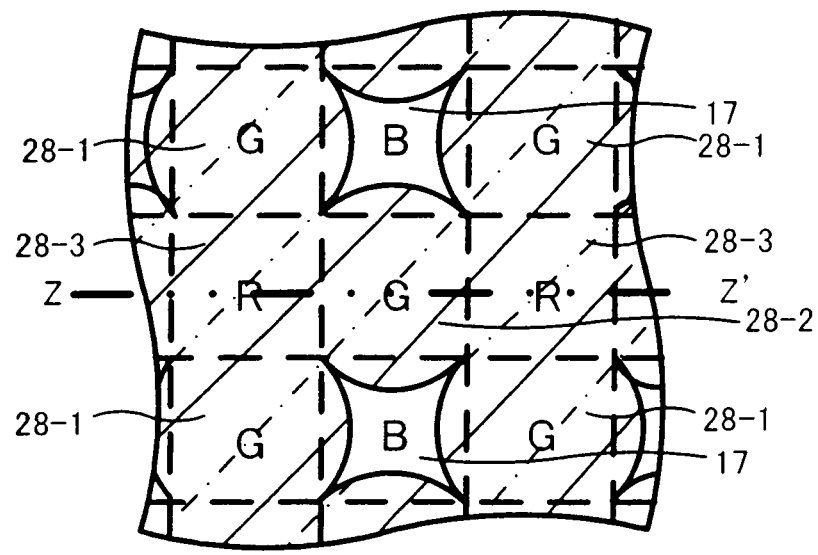
FIG. 27 is a top view illustrating a manufacturing process of the solid state image forming device illustrated in FIG. 14 according to the second embodiment.
Figure 28:
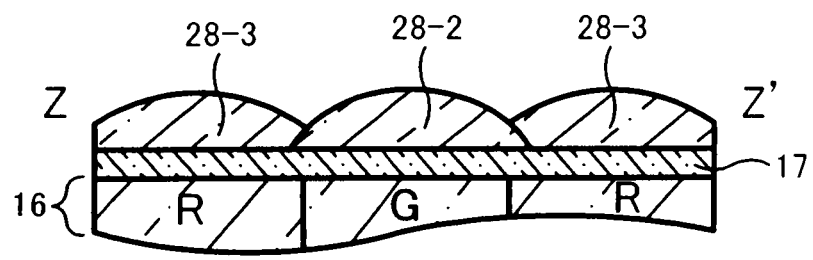
FIG. 28 is a sectional view taken along a two-dot chain line Z-Z' in FIG. 27.

Then, as illustrated in FIGS. 27 and 28, convex third microlenses 28-3 are formed by the melting method. That is, the third microlens material 26 is heat-treated, whereby the third microlens 28-3 is formed on the red color filter R. The third microlens 28-3 is further heated at a high temperature to be cured.

Figure 29:
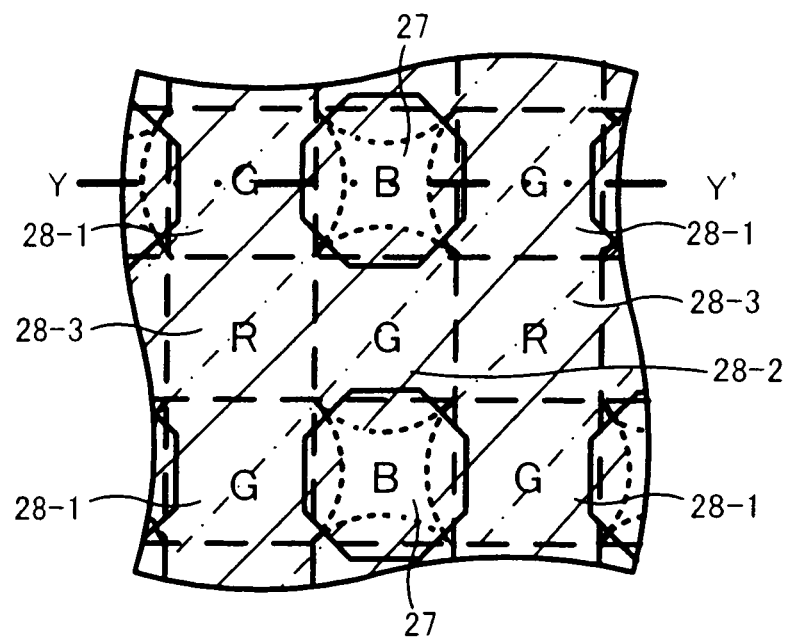
FIG. 29 is a top view illustrating a manufacturing process of the solid state image forming device illustrated in FIG. 14 according to the second embodiment.
Figure 30:
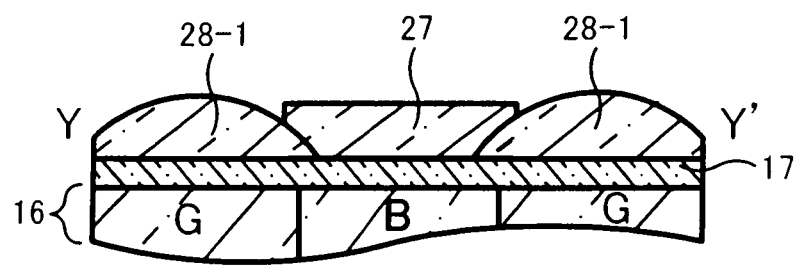
FIG. 30 is a sectional view taken along a two-dot chain line Y-Y' in FIG. 29.

Next, as illustrated in FIGS. 29 and 30, a fourth microlens material 27 is formed on the blue color filter B. The fourth microlens material 27 on the blue color filter B is formed in the same manner as in the third microlens material 26 illustrated in FIG. 25.

Finally, the fourth microlens 28-4 is formed on the blue color filter B by the melting method. Thus, the solid state image forming device illustrated in FIGS. 14 to 16 can be manufactured.

The third microlens 28-3 and the fourth microlens 28-4 may be formed such that the outer peripheries thereof are in contact with each other on the contact point between the blue color filter B and the red color filter R. Therefore, the order of forming the third microlens 28-3 and the order of forming the fourth microlens 28-4 may be reversed.

Even by the method for manufacturing the solid state image forming device according to the second embodiment described above, the first, second, third, and fourth microlenses 28-1, 28-2, 28-3, and 28-4 can be formed on the color filter layer 16 without having a gap therebetween, like the solid state image forming device formed by the method according to the first embodiment. Accordingly, the solid state image forming device manufactured by the manufacturing method according to the second embodiment can also prevent the color mixture.

Third Embodiment

Figure 31:
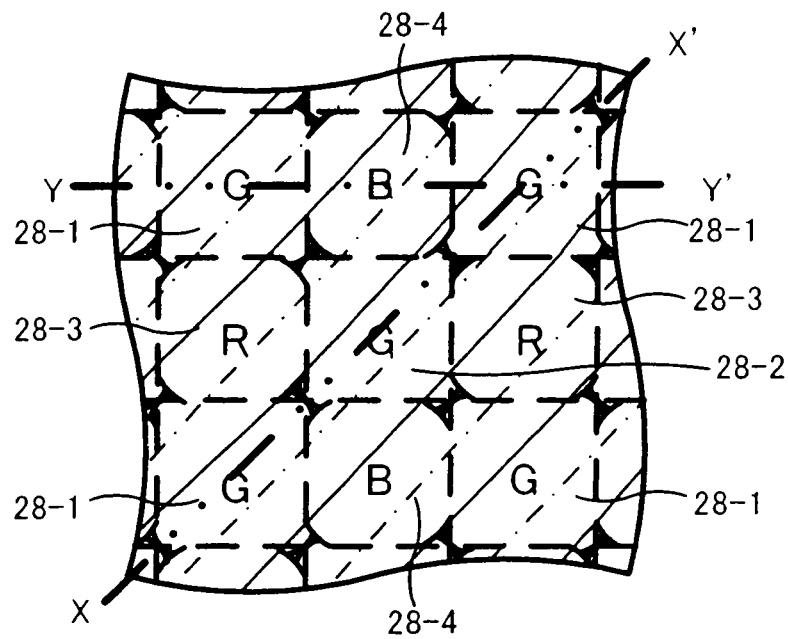
FIG. 31 is a top view illustrating a part of a solid state image forming device according to a third embodiment.
Figure 32:
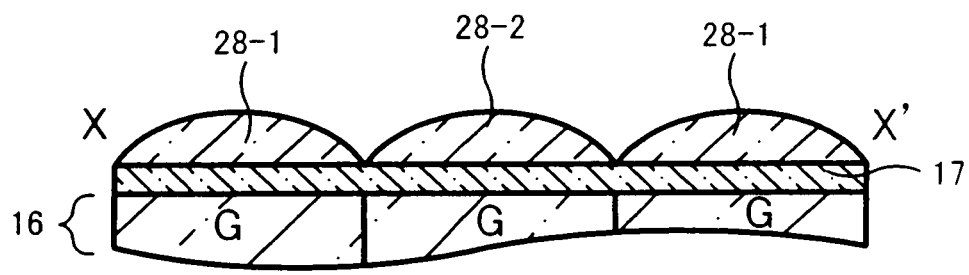
FIG. 32 is a sectional view taken along a two-dot chain line X-X' in FIG. 31.

FIG. 31 is a top view illustrating a solid state image forming device according to a third embodiment. FIG. 32 is a sectional view taken along a two-dot chain line X-X' in FIG. 31, while FIG. 33 is a sectional view taken along a two-dot chain line Y-Y' in FIG. 31.

Figure 33:
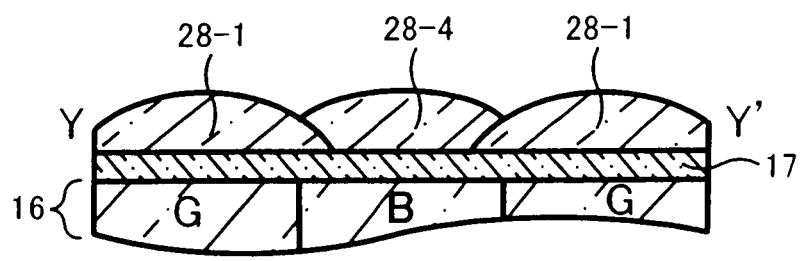
FIG. 33 is a sectional view taken along a two-dot chain line Y-Y' in FIG. 31.

As illustrated in FIGS. 32 and 33, in the third embodiment, the third and fourth microlenses are different from the third and fourth microlenses 28-3 and 28-4 in the second embodiment in that they are formed so as to be separated from each other on the contact point between the blue color filter B and the red color filter R.

Figure 34:
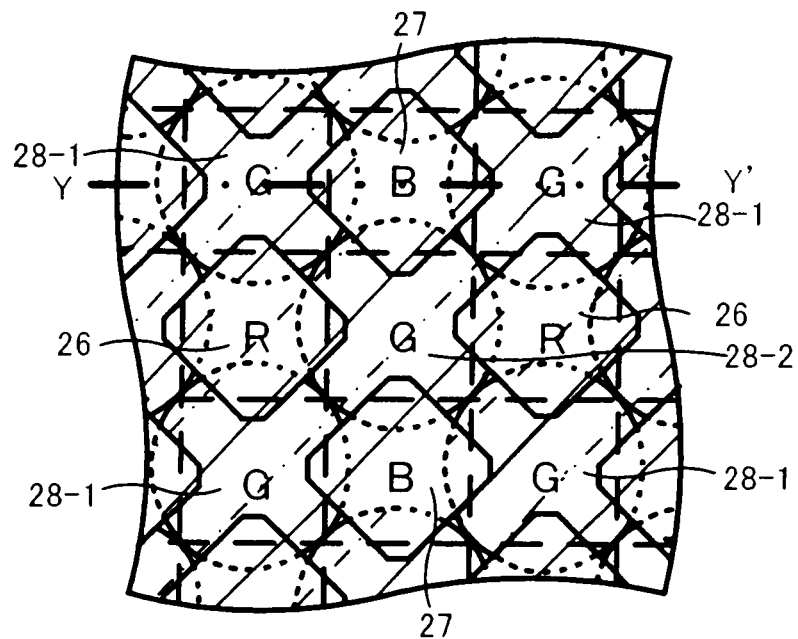
FIG. 34 is a top view illustrating a manufacturing process of the solid state image forming device illustrated in FIG. 31 according to the third embodiment.

Only the method for manufacturing the third and fourth microlenses 28-3 and 28-4 is different in the method according to the third embodiment. Therefore, the method will be described with reference to FIGS. 34 and 35 below. FIG. 34 is a top view illustrating the method for manufacturing the solid state image forming device, while FIG. 35 is a sectional view taken along a two-dot chain line Y-Y' in FIG. 34.

Figure 35:
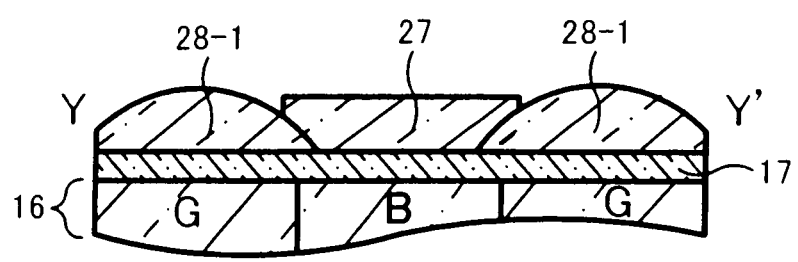
FIG. 35 is a sectional view taken along a two-dot chain line Y-Y' in FIG. 34.

In the third embodiment, the first and second microlenses 28-1 and 28-2 are formed, and then, an octagonal third microlens material 26, which is to become the third microlens 28-3, is formed on the red color filter R as illustrated in FIGS. 34 and 35, and at the same time, an octagonal fourth microlens material 27, which is to become the fourth microlens 28-4, is formed on the blue color filter B, like the method for manufacturing the solid state image forming device according to the second embodiment. These third and the fourth microlens material 26 and 27 are formed from the material same as that of the third and the fourth microlens materials 26 and 27 and formed by the manufacturing method same as that of the third and the fourth microlens materials 26 and 27. It is to be noted that the third and the fourth microlens materials 26 and 27 are formed in such a manner that the red color filter R and the blue color filter B are exposed more, compared to the third and the fourth microlens materials 26 and 27 illustrated in the second embodiment.

Then, the third microlens 28-3 is formed on the red color filter R, and at the same time, the fourth microlens 28-4 is formed on the blue color filter B, by the melting method. That is, the third and the fourth microlens materials 26 and 27 are heat-treated to be formed into a convex shape, and then, the resultant is heated at a high temperature, whereby the third and fourth microlenses 28-3 and 28-4 are simultaneously formed. In this case, the third and fourth microlenses 28-3 and 28-4 are formed so as to be separated from each other on the contact point between the red color filter R and the blue color filter B. This can be achieved by using the third microlens material 26 and the fourth microlens material 27, each having the size designed beforehand in order that the third microlens 28-3 and the fourth microlens 28-4 are not in contact with each other, when the third and the fourth microlens materials 26 and 27 are heat-treated. Thus, the solid state image forming device illustrated in FIGS. 31 to 33 can be manufactured.

Since the third and the fourth microlens materials 26 and 27 are formed so as to be separated from each other on the contact point between the red color filter R and the blue color filter B, when the third and the fourth microlens materials 26 and 27 are fluidized, the third and the fourth microlens materials 26 and 27 are connected to each other due to the heat treatment. Therefore, the shape of the lens is not deteriorated.

In the solid state image forming device formed by the manufacturing method according to the third embodiment described above, the third and fourth microlenses 28-3 and 28-4 are formed so as to be separated from each other on the contact point between the red color filter R and the blue color filter B. However, on the contact point, the first and the second microlenses 28-1 and 28-2 are formed such that the outer peripheries thereof are brought into contact with each other. Therefore, the first, second, third, and fourth microlenses 28-1, 28-2, 28-3, and 28-4 are formed on the color filter layer 16 without having a gap therebetween. Accordingly, the solid state image forming device manufactured by the manufacturing method according to the third embodiment can also prevent the color mixture.

In the method for manufacturing the solid state image forming device according to the third embodiment, the third and fourth microlenses 28-3 and 28-4 are formed at a time on the red color filter R and the blue color filter B. Therefore, the solid state image forming device can more easily be manufactured, compared to the method for manufacturing the solid state image forming device according to the second embodiment.

Fourth Embodiment

A solid state image forming device according to a fourth embodiment is obtained by applying the first and second microlenses 18-1 and 18-2, which are formed on the solid state image forming device according to the first embodiment, to a solid state image forming device of a so-called surface reflection type. The solid state image forming device according to the fourth embodiment will be described below. In the description, the top view of the solid state image forming device is the same as FIG. 1, so that the illustration by the figure is not repeated, and the solid state image forming device of a surface reflection type will be described with reference to FIG. 36 that is a sectional view taken along a two-dot chain line X-X' in FIG. 1 and FIG. 37 that is a sectional view taken along a two-dot chain line Y-Y' in FIG. 1.

Figure 36:
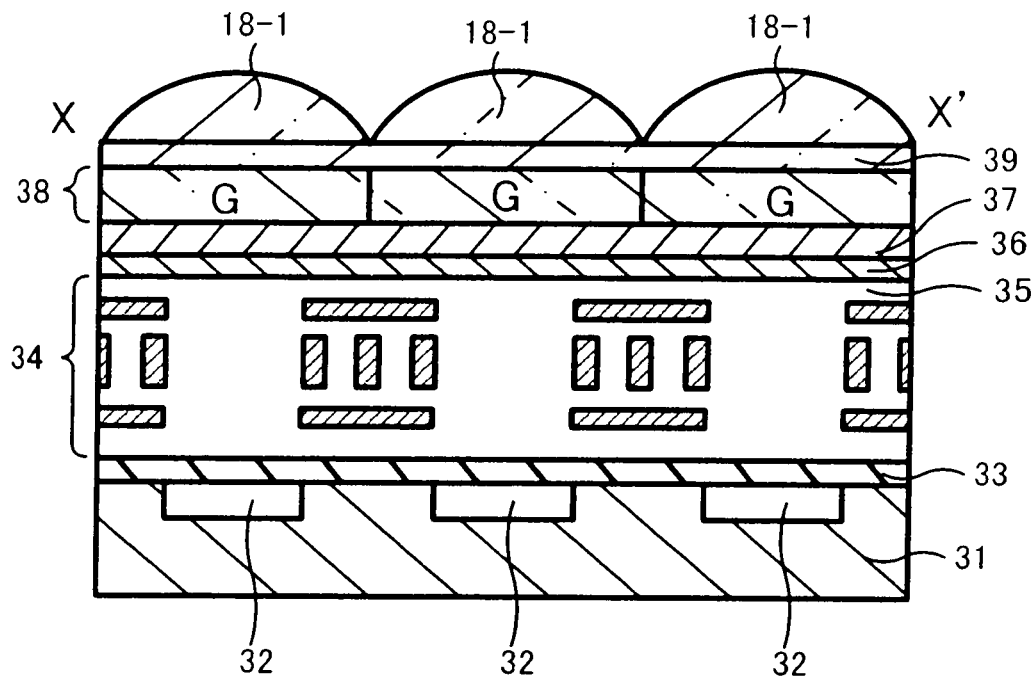
FIG. 36 is a sectional view illustrating a manufacturing process of the solid state image forming device according to the fourth embodiment taken along a two-dot chain line X-X'.
Figure 37:
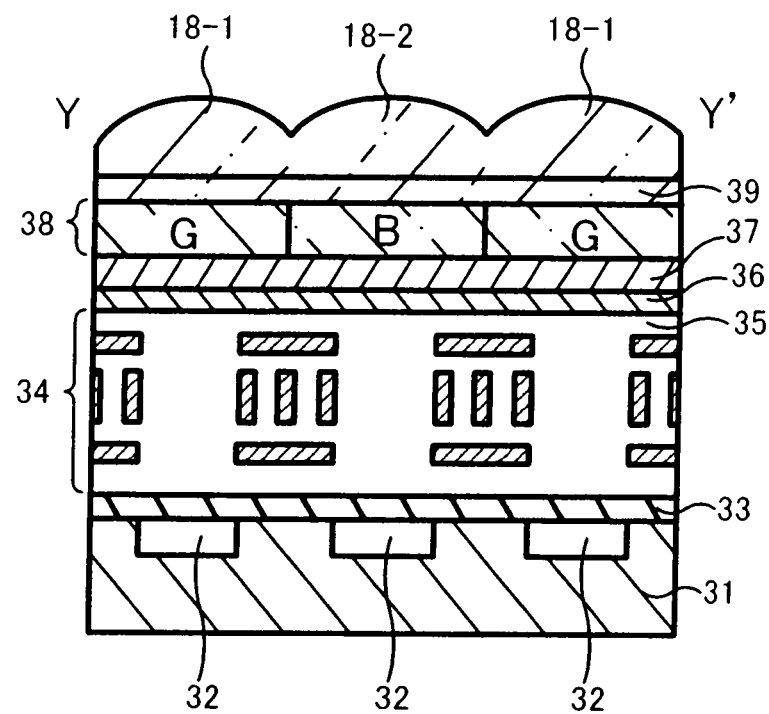
FIG. 37 is a sectional view illustrating a manufacturing process of the solid state image forming device according to the fourth embodiment taken along a two-dot chain line Y-Y'.

As illustrated in FIGS. 36 and 37, a solid state image forming device according to the fourth embodiment has photodiode layers 32 formed in a lattice on a surface of a semiconductor substrate 31. A wiring layer 34 is formed on the surface of the semiconductor substrate 31, having the photodiode layers 31 formed thereon, via a first oxide film 33. A second oxide film 35 is formed on the uppermost layer of the wiring layer 34, and a color filter layer 38 is formed on the second oxide film 35 via a passivation film 36 and a first planarizing layer 37. First and second microlenses 18-1 and 18-2 are formed on the color filter layer 38 via a second planarizing layer 39. The structures of the wiring layer 34, the color filter layer 38, the second planarizing layer 39, and the first and second microlenses 18-1 and 18-2 are the same as those of the solid state image forming device according to the first embodiment, so that the description will not be repeated.

The method for manufacturing the solid state image forming device according to the fourth embodiment is the same as the method for manufacturing the conventional surface-reflection type solid state image forming device, except for the method for manufacturing the first and second microlenses 18-1 and 18-2. The method for manufacturing the first and second microlenses 18-1 and 18-2 is as described in the first embodiment. Therefore, the description of the method for manufacturing the solid state image forming device according to the fourth embodiment will not be repeated here.

Even in the solid state image forming device formed by the method for manufacturing the solid state image forming device according to the fourth embodiment, the first and the second microlenses 18-1 and 18-2 are formed on the color filter layer 38 with no gap formed therebetween. Therefore, all the light incident on the surface-reflection type solid state image forming device passes through any one of the desired color filters G, B, and R by the first and second microlenses 18-1 and 18-2 and is always converged onto the photodiode layers 32. Consequently, this configuration not only can prevent the color mixture but also can enhance sensitivity, compared to the conventional surface-reflection type solid state image forming device.

While certain embodiments have been described, these embodiments have been presented by way of example only, and are not intended to limit the scope of the inventions. Indeed, the novel devices and methods described herein may be embodied in a variety of other forms: furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, the manufacturing methods according to the second and third embodiments may be applied to the method for manufacturing the surface-reflection type solid state image forming device according to the fourth embodiment.

In the manufacturing methods of the respective embodiments, the shapes of the first mother die material 21, the second mother die material (not illustrated), and the first to fourth microlens materials 25, 26, and 27 are not limited to be octagonal.

The color filter layers 16 and 38 in the solid state image forming devices according to the respective embodiments are configured such that R, G, and B color filters are arranged according to the Bayer arrangement. However, the type and arrangement of the color filters are not limited to those of the color filter layers 16 and 38 in the respective embodiments.

The pixel number formed in the solid state image forming device in each of the respective embodiments is not limited to the number illustrated in each of the embodiments.

What is claimed is:
1. A method for manufacturing a solid state image forming device comprising:
  forming a transparent resin layer on a first surface of a semiconductor substrate having a plurality of photodiode layers formed thereon in a lattice;

forming a plurality of first microlens mother die materials on the transparent resin layer so as to be arranged checkerwise corresponding to the positions of the plurality of photodiode layers and to be separated from each other;

forming a plurality of first microlens mother dies so as to be separated from each other, wherein the plurality of first microlens mother dies are formed by a heat treatment of the plurality of first microlens mother die materials;

forming a plurality of second microlens mother die materials in such a manner that they are arranged between the plurality of first microlens mother dies respectively, and are overlapped with outer peripheries of the plurality of first microlens mother dies in horizontal and vertical directions with respect to a lattice arrangement of the plurality of photodiode layers and are separated from each other in a diagonal direction with respect to the lattice arrangement;

forming a plurality of second microlens mother dies so as to be overlapped with outer peripheries of the plurality of first microlens mother dies in the horizontal and vertical directions and separated from each other in the diagonal direction, wherein said plurality of second microlens mother dies are formed by a heat treatment of the plurality of second microlens mother die materials; and forming a plurality of first microlenses and a plurality of second microlenses by etching the transparent resin layer by using the plurality of first microlens mother dies and the plurality of second microlens mother dies as masks, wherein the transparent resin layer is etched so that the plurality of first microlenses and the plurality of second microlenses which are formed are in contact with each other.

2. A method for manufacturing a solid state image forming device according to claim 1, wherein the planar shapes of the plurality of photodiode layers and a plurality of color filters stacked thereon in a section parallel to the surface of the semiconductor substrate are square, and the planar shapes of the first and second microlens mother die materials in a section parallel to the surface of the semiconductor substrate are polygonal.

3. A method for manufacturing a solid state image forming device according to claim 2, wherein the plurality of first and second microlens mother die materials are made of a photosensitive thermosetting resin.

4. A method for manufacturing a solid state image forming device according to claim 3, wherein the transparent resin layer or a planarizing layer is formed on the first surface of the semiconductor substrate, and a wiring layer is formed on a second surface of the semiconductor substrate.

5. A method for manufacturing a solid state image forming device according to claim 3, wherein a wiring layer is formed on the first surface of the semiconductor substrate, and the transparent resin layer or a planarizing layer is formed on the wiring layer of the semiconductor substrate.

6. A method for manufacturing a solid state image forming device comprising:

forming a planarizing layer on a first surface of a semiconductor substrate having a plurality of photodiode layers formed thereon in a lattice;

forming a plurality of first microlenses and a plurality of second microlenses from first and second microlens materials, respectively, on the planarizing layer so as to be arranged checkerwise corresponding to the positions of the plurality of photodiode layers;

after the plurality of first microlenses and the plurality of second microlenses are formed, forming a plurality of third microlenses materials so as to be arranged at every other gap among the plurality of gaps formed between the plurality of first microlenses and the plurality of second microlenses, and to be overlapped with outer peripheries of the plurality of first microlenses and outer peripheries of the plurality of second microlenses in a horizontal and vertical directions with respect to a lattice arrangement of the plurality of photodiode layers;

forming plurality of third microlenses so as to be overlapped with outer peripheries of the plurality of first microlenses and outer peripheries of the plurality of second microlenses in the horizontal and vertical directions, wherein the plurality of third microlenses are formed by a heat treatment of the plurality of third microlenses materials;

after the plurality of third microlenses are formed, forming a plurality of fourth microlens materials so as to be arranged at gaps, among the plurality of gaps formed between the plurality of first microlenses and the plurality of second microlenses, where the third microlenses are not formed, and to be overlapped with outer peripheries of the plurality of first microlenses and outer peripheries of the plurality of second microlenses in the horizontal and vertical directions and to be separated from the plurality of third microlenses in a diagonal direction with respect to the lattice arrangement; and forming a plurality of fourth microlenses so as to be overlapped with outer peripheries of the plurality of first microlenses and outer peripheries of the plurality of second microlenses in the horizontal and vertical directions and to be in contact with outer peripheries of the plurality of third microlenses in the diagonal direction, wherein the plurality of fourth microlenses are formed by a heat treatment of the plurality of fourth microlens materials.

7. A method for manufacturing a solid state image forming device according to claim 6, wherein the planar shapes of the plurality of photodiode layers and color filters stacked thereon in a section parallel to the surface of the semiconductor substrate are square, the planar shapes of the first to fourth microlens materials in a section parallel to the surface of the semiconductor substrate are polygonal, and the planar shapes of the first to fourth microlenses formed by heat treating the first to fourth microlens materials in a section parallel to the surface of the semiconductor substrate are substantially circular.

8. A method for manufacturing a solid state image forming device according to claim 7, wherein the plurality of first to fourth microlens materials are made of a photosensitive thermosetting resin.

9. A method for manufacturing a solid state image forming device according to claim 6, wherein the planarizing layer is formed on the first surface of the semiconductor substrate, and a wiring layer is formed on a second surface of the semiconductor substrate.

10. A method for manufacturing a solid state image forming device according to claim 6, wherein a wiring layer is formed on the first surface of the semiconductor substrate, and the planarizing layer is formed on the wiring layer of the semiconductor substrate.

* * * * *